United States Patent [19]

Kaneaki et al.

[11] Patent Number: 5,006,851
[45] Date of Patent: Apr. 9, 1991

[54] ANALOG-TO-DIGITAL CONVERTING SYSTEM

[75] Inventors: Tetsuhiko Kaneaki, Ashiya; Mikio Oda, Kyoto; Kozo Nuriya; Yasunori Tani, both of Osaka, all of Japan

[73] Assignee: Matsushita Electric Industrial Co., Ltd., Osaka, Japan

[21] Appl. No.: 380,355

[22] Filed: Jul. 17, 1989

[30] Foreign Application Priority Data

| Jul. 18, 1988 | [JP] | Japan | 63-178625 |
| Feb. 8, 1989 | [JP] | Japan | 1-29079 |
| Feb. 9, 1989 | [JP] | Japan | 1-30534 |
| Mar. 13, 1989 | [JP] | Japan | 1-59902 |

[51] Int. Cl.$^5$ .............................. H03M 1/12
[52] U.S. Cl. .................... 341/155; 341/118
[58] Field of Search ............... 341/118, 127, 128, 131, 341/155, 158, 159, 139

[56] References Cited

U.S. PATENT DOCUMENTS

| 3,725,687 | 4/1973 | Heightley | 341/155 |
| 4,308,524 | 12/1981 | Harrison et al. | 341/118 |
| 4,345,241 | 8/1982 | Takeuchi et al. | 341/155 |
| 4,398,179 | 8/1983 | Kaneko | 341/131 |
| 4,540,974 | 9/1985 | Schanne et al. | 341/155 |
| 4,584,558 | 4/1986 | Maschek et al. | 341/155 |
| 4,739,307 | 4/1988 | Marcovici et al. | 341/155 |
| 4,794,369 | 12/1988 | Haferd | 341/118 |
| 4,811,018 | 3/1989 | Sakata | 341/126 |
| 4,851,842 | 7/1989 | Iwamatsu | 341/155 |

Primary Examiner—A. D. Pellinen
Assistant Examiner—Brian K. Young
Attorney, Agent, or Firm—Pollock, VandeSande & Priddy

[57] ABSTRACT

A first analog input signal is converted into a plurality of second analog signals having different levels respectively. The second analog signals are inputted into respective analog-to-digital converters. Values of output signals from the respective converters are adjusted in accordance with the values of the output signals from the respective converters to convert the output signals from the respective converters into respective adjusted signals. One of the adjusted signals is selected in accordance with the values of the output signals from the respective converters. The selected signal is produced as a system output signal.

15 Claims, 9 Drawing Sheets

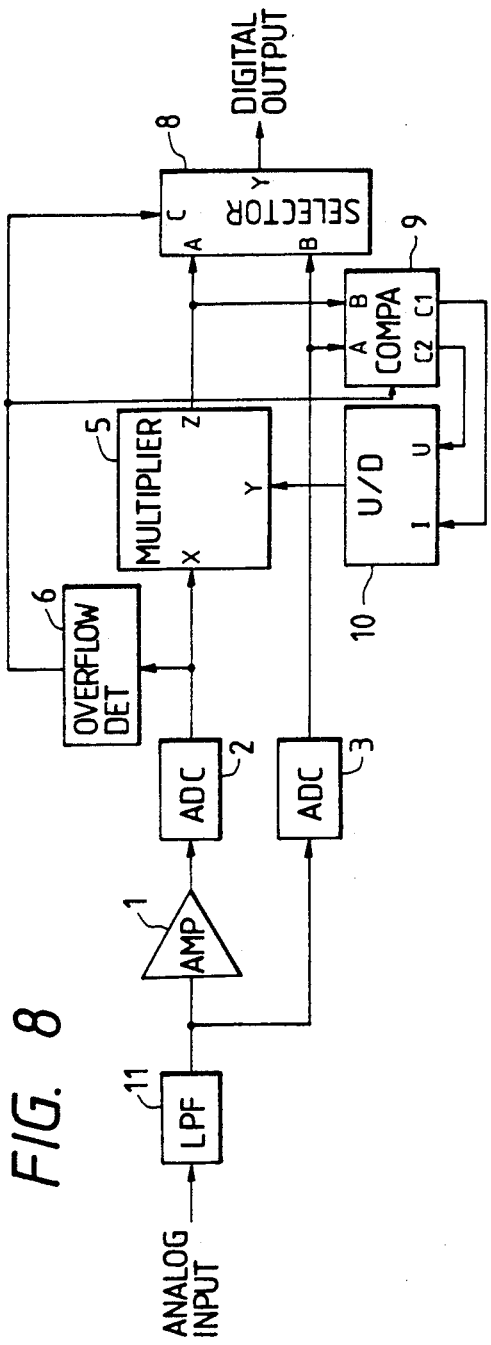
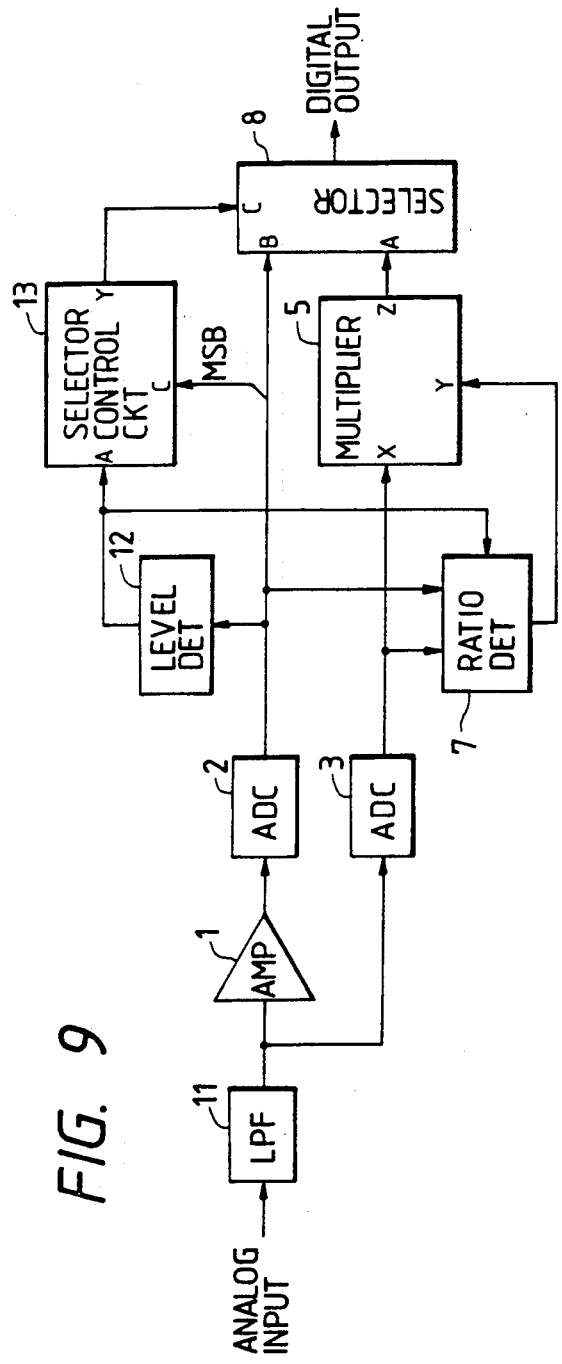

ANALOG-TO-DIGITAL CONVERTING SYSTEM

BACKGROUND OF THE INVENTION

1. Field of the Invention

This invention relates to an analog-to-digital converting system.

2. Description of the Prior Art

Prior art analog-to-digital converting systems of a successive comparison type include a comparator, a register control circuit, a successive comparison register, and an analog-to-digital converter connected in a closed loop. A high resolution of such a prior art analog-to-digital converting system requires high speed operation of the comparator and the analog-to-digital converter. In addition, the lower bit portion of data output from the prior art analog-to-digital converting system tends to be affected by noise.

SUMMARY OF THE INVENTION

It is an object of this invention to provide a high quality analog-to-digital converting system.

In an analog-to-digital converting system of this invention, a first analog input signal is converted into a plurality of second analog signals having different levels respectively. The second analog signals are applied to inputs of respective analog-to-digital converters. Values of output signals from the respective converters are adjusted in accordance with the values of the output signals from the respective converters to convert the output signals from the respective converters into respective adjusted signals. One of the adjusted signals is selected in accordance with the values of the output signals from the respective converters. The selected signal is outputted as a system output signal.

BRIEF DESCRIPTION OF THE DRAWINGS

FIG. 8 is a block diagram of an analog-to-digital converting system according to a fifth embodiment of this invention.

FIG. 9 is a block diagram of an analog-to-digital converting system according to a sixth embodiment of this invention.

Like and corresponding elements are denoted by the same reference characters throughout the drawings.

DESCRIPTION OF THE FIRST PREFERRED EMBODIMENT

Figure 1:
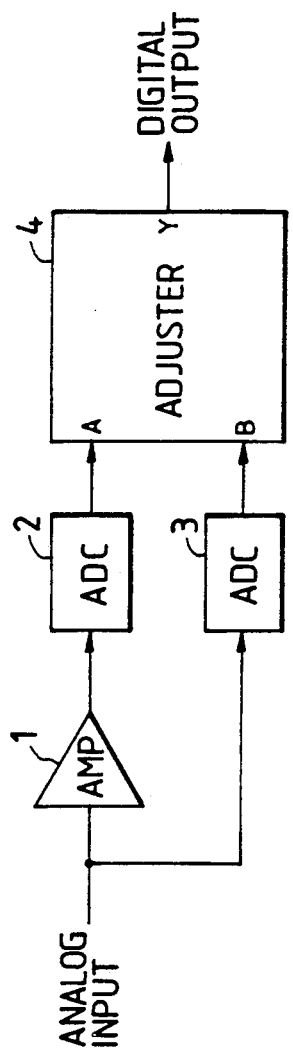
FIG. 1 is a block diagram of an analog-to-digital converting system according to a first embodiment of this invention.

With reference to FIG. 1, an analog input signal is fed to an analog-to-digital converter (referred to as an ADC hereinafter) 2 via an amplifier 1 having a gain of about 24 dB. The ADC 2 converts the fed analog signal into a corresponding digital signal. The analog input signal is also applied to an ADC 3. The ADC 3 converts the applied analog signal into a corresponding digital signal. The ADCs 2 and 3 have approximately equal characteristics. The ADCs 2 and 3 have a resolution corresponding to 16 bits. The levels of offset of the ADCs 2 and 3 are nullified or removed. An adjuster 4 has input terminals A and B receiving the digital output signals from the ADCs 2 and 3 respectively. The adjuster 4 outputs a 20-bit digital signal. Specifically, the adjuster 4 determines or detects the ratio between the levels of the digital signals received via the terminals A and B and equalizes the levels of the two input signals by use of the determined level ratio. When the ADC 2 overflows, the adjuster 4 selects the digital signal from the ADC 3 and provides the selected signal. Otherwise, the adjuster 4 selects the digital signal from the ADC 2 and provides the selected signal.

While the analog input signal is directly applied to the ADC 3, it is amplified by the amplifier 1 at a gain of 24 dB and is then applied to the ADC 2. Since the analog input signal is amplified by the amplifier 1 at a gain of 24 dB and the ADCs 2 and 3 have similar characteristics, the output digital value from the ADC 2 is about 16 times as large as the output digital value from the ADC 3 in normal cases. When the analog input signal has a large amplitude, the ADC 2 overflows and only the ADC 3 operates normally. In the absence of an overflow of the ADC 2, the adjuster 4 accurately calculates the ratio between the output digital values from the ADCs 2 and 3. When the ADC 2 does not overflow, the adjuster 4 selects the output signal from the ADC 2 and passes the the output signal from the ADC 2. When the ADC 2 overflows, the adjuster 4 selects the output digital value from the ADC 3 and multiplies the output digital value from the ADC 3 by a factor corresponding to the calculated ratio, providing the result of the multiplication.

In cases where the ratio between the output digital values from the ADCs 2 and 3 which is calculated by the adjuster 4 is 15.75, when the ADC 2 does not overflow, the adjuster 4 outputs a 20-bit digital signal whose lower 16 bits are equal to the 16-bit output digital signal from the ADC 2 and whose higher 4 bits have a code representing the sign of the output digital signal. In these cases, when the ADC 2 overflows, the adjuster 4 multiplies the output digital value from the ADC 3 by 15.75 and outputs generates the higher 20 bits of the result of the multiplication.

In this embodiment, even when the ADCs 2 and 3 have a usual resolution and a usual operating speed, the input analog signal is converted into the output digital signal with a high resolution of a higher number of bits. The number of bits of the output digital signal can be varied with the gain of the amplifier 1. Since the selection of the output signals from the ADCs 2 and 3 is performed in response to the result of the processing of the digital signals, noises or clicks are prevented from affecting the output digital signal.

DESCRIPTION OF THE SECOND PREFERRED EMBODIMENT

Figure 2:
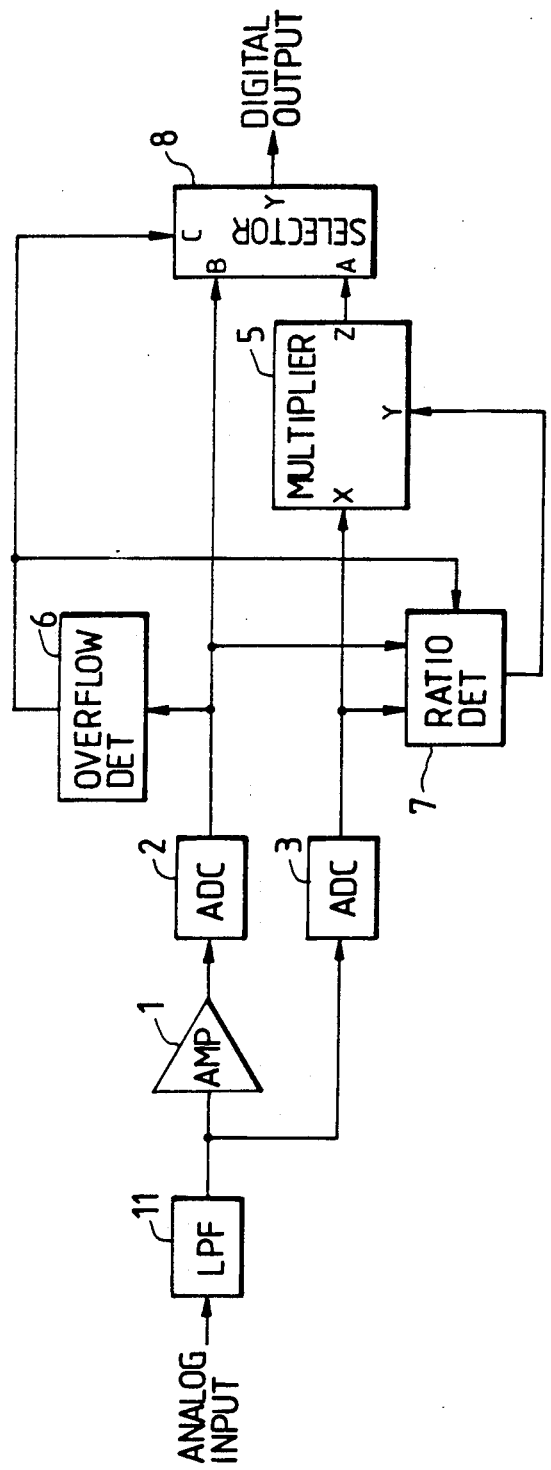
FIG. 2 is a block diagram of an analog-to-digital converting system according to a second embodiment of this invention.

FIG. 2 shows a second embodiment of this invention which is similar to the embodiment of FIG. 1 except for the following arrangements.

In the embodiment of FIG. 2, an input analog signal is fed to an amplifier 1 and an ADC 3 via a low pass filter (LPF) 11. The LPF 11 limits the frequency band of the input analog signal. An output signal from the amplifier 1 is fed to an ADC 2.

A multiplier 5 multiplies two 16-bit wide data applied to its input terminals X and Y. The multiplier 5 rounds the upper 21-th bit of the result of the multiplication and essentially provides the higher 20 bits of the result of the multiplication via its output terminal Z. The output digital signal from the ADC 3 is fed to the input terminal X of the multiplier 5.

An overflow detector 6 detects an overflow of the ADC 2 by monitoring the output digital signal from the ADC 2. When the overflow is detected, the overflow detector 6 outputs a signal "1". Otherwise, the overflow detector 6 outputs a signal "0".

A ratio detector 7 is informed by the overflow detector 6 of whether or not the ADC 2 overflows. When the ADC 2 does not overflow, the ratio detector 7 calculates the ratio between the output digital values from the ADCs 2 and 3. The ratio detector 7 outputs 16-bit wide data representing the calculated ratio. The output 16-bit data from the ratio detector 7 is fed to the input terminal Y of the multiplier 5.

A selector 8 has input terminals A and B receiving the output signals from the multiplier 5 and the ADC 2 respectively. The selector 8 also has a control terminal C receiving the output signal from the overflow detector 6. The selector 8 selects the output signal from the multiplier 5 and provides the selected signal via its output terminal Y when the output signal from the overflow detector 6 is "1", that is, when the ADC 2 overflows. The selector 8 selects the provides signal from the ADC 2 and outputs the selected signal via its output terminal Y when the output signal from the overflow detector 6 is "0", that is, when the ADC 2 does not overflow. While the digital signal fed to the input terminal A of the selector 8 has 20 bits, the digital signal fed to the input terminal B of the selector 8 has 16 bits. When the digital signal fed to the input terminal B is selected, the selector 8 adds four code bits to the MSB side of the selected digital signal and provides the resultant signal which has 20 bits. The four code bits agree with the sign of the selected digital signal, and are "0000" and "1111" when the digital signal is positive and negative respectively.

When the amplitude of the input analog signal is small and the ADC 2 does not overflow, the output digital signal from the ADC 2 is selected by the selector 8. In this case, the four code bits are added to the output digital signal from the ADC 2 and the result of the addition is provided from the selector 8. When the amplitude of the input analog signal is large and the ADC 2 overflows, the selector 8 selects and outputs the result of the multiplication between the output digital data from the ADC 3 and the ratio determined by the ratio detector 7.

Figure 3:
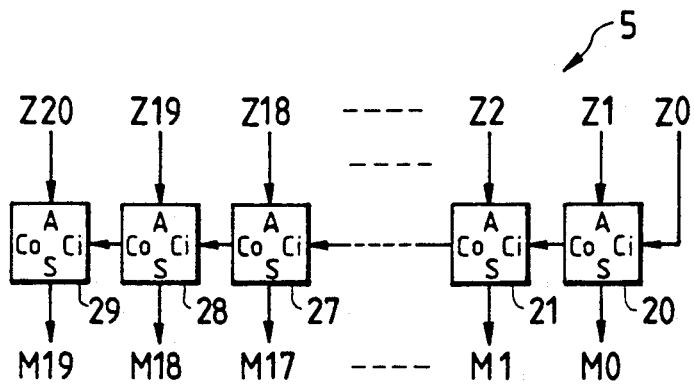
FIG. 3 is a block diagram of the multiplier of FIG. 2.

As shown in FIG. 3, a rounding section of the multiplier 5 includes a series combination of half adders 20-29 each having a carry input terminal Ci, a carry output terminal Co, an adding input terminal A, and an addition result output terminal B. The rounding section adds the 21-th bit $Z_0$ of the multiplication result to the higher 20 bits $Z_{20}$-$Z_1$ of the multiplication result, so that "1" and "0" are added to the higher 20 bits $Z_{20}$-$Z_1$ when the bit $Z_0$ is "1" and "0" respectively.

In cases where the analog signal inputted applied to the ADC 2 is in a given range, the ADC 2 accurately converts the analog signal into the corresponding digital signal. In cases where the analog signal applies to the ADC 2 resides outside the given range, the ADC 2 fails to perform an accurate conversion. The ADC 2 is designed so as to output "0111 1111 1111 1111" and "1000 0000 0000 0000" when the analog signal applied to the ADC 2 moves above and below the given range respectively. The overflow detector 6 functions to detect "0111 1111 1111 1111" and "1000 0000 0000 0000" of the output signal from the ADC 2.

Figure 4:
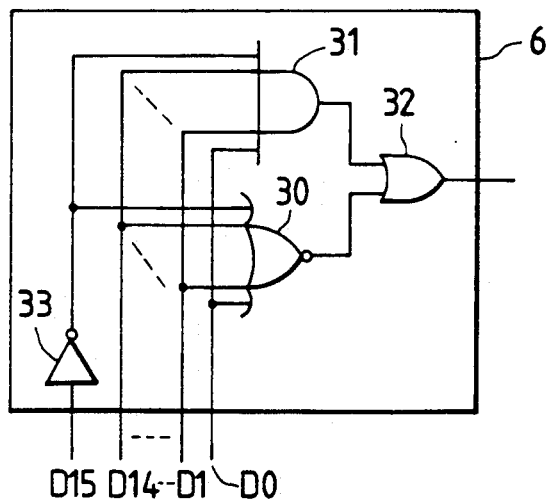
FIG. 4 is a block diagram of the overflow detector of FIG. 2.

As shown in FIG. 4, the overflow detector 6 includes a NOR gate 30 and an AND gate 31 each subjected to the first to the fifteenth bits $D_{14}$-$D_0$ of the output signal from the ADC 2 and the inversion of the sixteenth bit $D_{15}$ of the output signal from the ADC 2. The inversion of the sixteenth bit $D_{15}$ is obtained by an inverter 33. The output terminals of the NOR gate 30 and the AND gate 31 are connected to the input terminals of an OR gate 32. When the ADC 2 overflows, the OR gate 32 provides "1". Otherwise the OR gate 32 provides "0".

Figure 5:
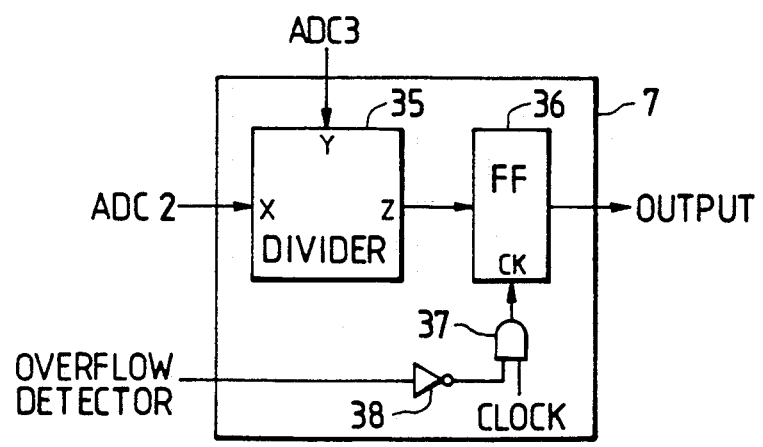
FIG. 5 is a block diagram of the ratio detector of FIG. 2.

As shown in FIG. 5, the ratio detector 7 includes a divider 35 having input terminals X and Y receiving the output digital signals from the ADCs 2 and 3 respectively. The divider 35 divides the output digital value from the ADC 2 by the output digital value from the ADC 3 and thereby calculates the ratio between the output digital values from the ADCs 2 and 3. The divider 35 outputs the result of the division via its output terminal Z. The output signal from the divider 35 is held by flip-flops 36 forming a register. The output signal from the flip-flops 36 is fed to the multiplier 5. The output terminal of the overflow detector 6 is connected to a first input terminal of an AND gate 37 via an inverter 38. A second input terminal of the AND gate 37 is subjected to the system clock signal (the sampling signal used in the analog-to-digital converting system or the signal whose frequency equals the sampling frequency of the system). The output terminal of the AND gate 37 is connected to the clock input terminals of the flip-flops 36. The flip-flops 36 sample the output signal from the divider 35 in response to the "0" signal from the overflow detector 6 so that the flip-flops 36 sample and hold the calculated ratio between the output digital values from the ADCs 2 and 3 which occurs in the absence of an overflow of the ADC 2.

The ratio detector 7 may be designed so as to memorize the output signal from the ADC 2 when the ADC 3 provides a specific value such as "0000 01000 0000 0000".

This embodiment may be modified as follows. In a first modification, the amplifier 1 is removed and the LPF 11 is directly connected to the ADC 2, and an attenuator is disposed between the LPF 11 and the ADC 3. In a second modification, one or more ADCs are added and different levels of the input analog signals are applied to the ADCs 2 and 3 and the added ADCs.

DESCRIPTION OF THE THIRD PREFERRED EMBODIMENT

Figure 6:
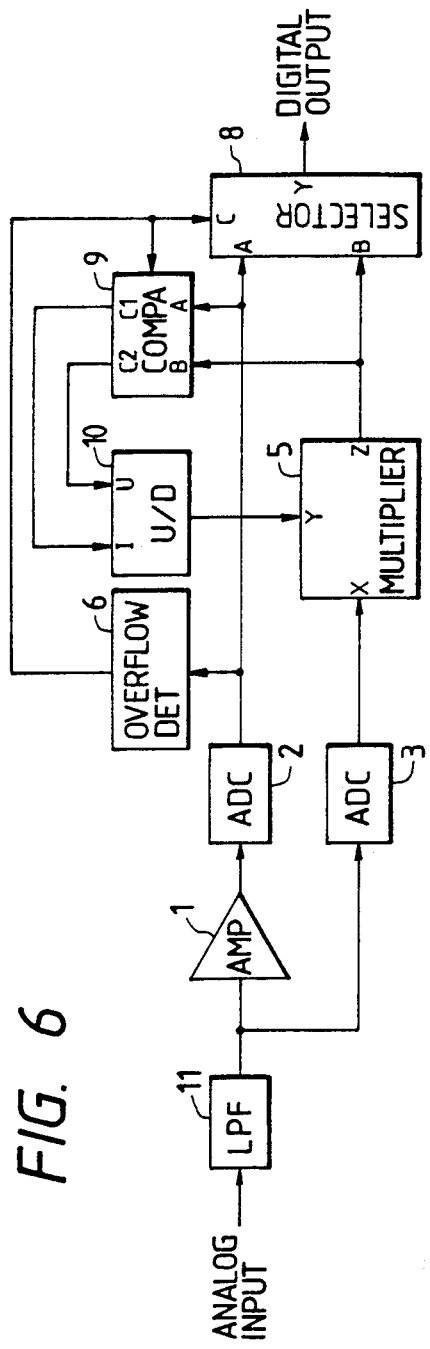
FIG. 6 is a block diagram of an analog-to-digital converting system according to a third embodiment of this invention.

FIG. 6 shows a third embodiment of this invention which is similar to the embodiment of FIGS. 2-5 except for the following arrangements.

In the embodiment of FIG. 6, a comparator 9 monitors the output signal from an overflow detector 6 and compares the output data from an ADC 2 and the output data from a multiplier 5. Specifically, in the absence of an overflow of the ADC 2, when the output digital value from the ADC 2 equals the output digital value from the multiplier 5, the comparator 9 outputs "1" and "0" via its output terminals C1 and C2 respectively. In the absence of an overflow of the ADC 2, when the absolute value of the output data from the ADC 2 is smaller than the absolute value of the output data from the multiplier 5, the comparator 9 outputs "0" and "0" via its output terminals C1 and C2 respectively. In the absence of an overflow of the ADC 2, when the absolute value of the output data from the ADC 2 is greater than the absolute value of the output data from the multiplier 5, the comparator 9 outputs "0" and "1" via its output terminals C1 and C2 respectively. In the presence of an overflow of the ADC 2, the comparator 9 outputs "1" and "0" via its output terminals C1 and C2 respectively.

An up-down counter 10 has input terminals I and U connected to the output terminals C1 and C2 of the comparator 9 respectively. When the input terminal I is subjected to "1", the counter 10 interrupts counting. When the terminal U is subjected to "1", the counter 10 performs counting up. When the terminal U is subjected to "0", the counter 10 performs counting down. The output signal from the counter 10 is applied to the input terminal Y of the multiplier 5.

The multiplier 5 multiplies the output digital value from an ADC 3 by the output digital value from the counter 10. The result of this multiplication is compared by the comparator 9 with the output digital value from the ADC 2. When the absolute value of the result of the multiplication is smaller than the absolute value of the output data from the ADC 2, the comparator 9 provides "0" and "1" via its output terminals C1 and C2 respectively so that the counter 10 performs counting up and thus the output digital value from the counter 10 increases. The increase in the output digital value from the counter 10 causes an increase in the output digital value from the multiplier 5. This increase causes the absolute value of the output data from the multiplier 5 to become equal to the absolute value of the output data from the ADC 2. When the absolute value of the result of the multiplication is greater than the absolute value of the output data from the ADC 2, the comparator 9 provides "0" and "0" via its output terminals C1 and C2 respectively so that the counter 10 performs counting down and thus the output digital value from the counter 10 decreases. The decrease in the output digital value from the counter 10 causes a decrease in the output digital value from the multiplier 5. This decrease causes the absolute value of the output data from the multiplier 5 to become equal to the absolute value of the output data from the ADC 2. As a result of these feedback operations, the output digital value from the multiplier 5 is essentially held equal to the output digital value from the ADC 2. One of the output data from the multiplier 5 and the output data from the ADC 2 is selected by a selector 8 in response to the output signal from the overflow detector 6.

For example, the counter 10 is of the 20-bit type, and the higher 16 bits thereof are fed to the multiplier 5. In this case, the output data from the counter 10 is stable.

It should be noted that the comparator 9 may perform the data comparison only when the data are positive.

DESCRIPTION OF THE FOURTH PREFERRED EMBODIMENT

Figure 7:
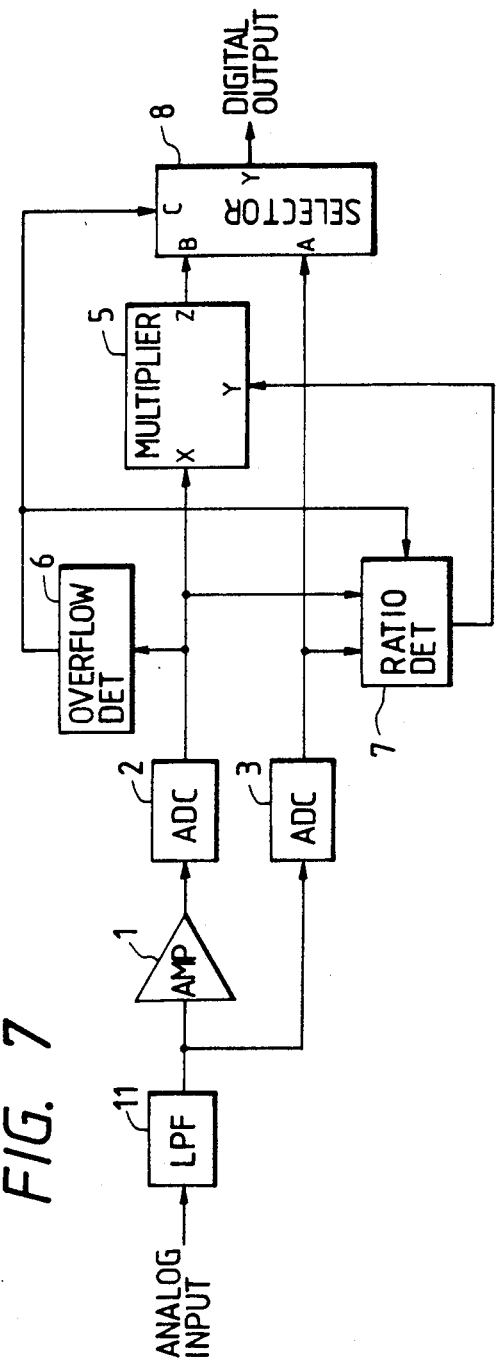
FIG. 7 is a block diagram of an analog-to-digital converting system according to a fourth embodiment of this invention.

FIG. 7 shows a fourth embodiment of this invention which is similar to the embodiment of FIGS. 2-5 except for the following design changes.

In the embodiment of FIG. 7, a multiplier 5 is connected between an ADC 2 and a selector 8. In addition, a ratio detector 7 divides the digital output value from an ADC 3 by the digital output value from the ADC 2 and provides the result of the division to the multiplier 5. One of the output data from the multiplier 5 and the output data from the ADC 3 is selected by the selector 8 in response to the output signal from an overflow detector 6.

It should be noted that the ratio detector 7 may memorize the output data from the ADC 3 when the ADC 2 provides specific data such as "0100 0000 0000 0000".

DESCRIPTION OF THE FIFTH PREFERRED EMBODIMENT

FIG. 8 shows a fifth embodiment of this invention which is similar to the embodiment of FIG. 6 except for the following design changes.

In the embodiment of FIG. 8, a multiplier 5 is connected between an ADC 2 and a selector 8. In addition, the output terminal of an ADC 3 is directly connected to an input terminal of the selector 8.

The multiplier 5 multiplies the output digital value from the ADC 2 by the output digital value from a counter 10. The result of this multiplication is compared by a comparator 9 with the output digital value from the ADC 3. When the absolute value of the result of the multiplication is smaller than the absolute value of the output data from the ADC 3, the comparator 9 outputs "0" and "1" via its output terminals C1 and C2 respectively so that the counter 10 performs counting up and thus the output digital value from the counter 10 increases. The increase in the output digital value from the counter 10 causes an increase in the output digital value from the multiplier 5. This increase causes the absolute value of the output data from the multiplier 5 to become equal to the absolute value of the output data from the ADC 3. When the absolute value of the result of the multiplication is greater than the absolute value of the output data from the ADC 3, the comparator 9 outputs "0" and "0" via its output terminals C1 and C2 respectively so that the counter 10 performs counting down and thus the output digital value from the counter 10 decreases. The decrease in the output digital value from the counter 10 causes a decrease in the output digital value from the multiplier 5. This decrease causes the absolute value of the output data from the multiplier 5 to become equal to the absolute value of the output data from the ADC 3. As a result of these feedback operations, the output digital value from the multiplier 5 is essentially held equal to the output digital value from the ADC 3. One of the output data from the multiplier 5 and the output data from the ADC 3 is selected by the selector 8 in response to the output signal from an overflow detector 6.

DESCRIPTION OF THE SIXTH PREFERRED EMBODIMENT

FIG. 9 shows a sixth embodiment of this invention which is similar to the embodiment of FIGS. 2-5 except for the following design changes.

In the embodiment of FIG. 9, the overflow detector 6 (see FIG. 2) is replaced by a combination of a level detector 12 and a selector control circuit 13.

The input terminal of the level detector 6 is connected to the output terminal of an ADC 2. The level detector 6 is designed so as to detect whether or not the ADC 2 overflows. Specifically, when the output digital value from the ADC 2 increases above a predetermined positive reference value or decreases below a predetermined negative reference value, the level detector 6 outputs "1" to the selector control circuit 13 and a ratio detector 7. Otherwise, the level detector 12 outputs "0". The "1" signal from the level detector 12 basically represents an overflow of the ADC 2. For example, the predetermined positive and negative values are "+31744" and "−31744" respectively. The structure of the selector control circuit 13 will be described hereinafter.

When the level detector 12 detects that the ADC 2 does not overflow, the output signal from the level detector 12 enables the ratio detector 7 to calculate the ratio between the output digital value from the ADC 2 and the output digital value from an ADC 3. A multiplier 5 multiplies this calculated ratio by the digital output value from the ADC 3. One of the output data from the ADC 2 and the output data from the multiplier 5 is selected by a selector 8 in response to the output signal from the selector control circuit 13.

Figure 10:
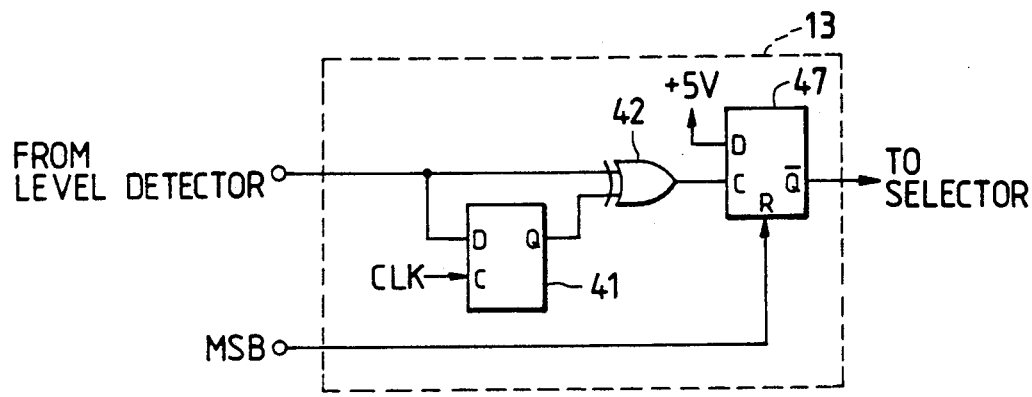
FIG. 10 is a block diagram of the selector control circuit of FIG. 9.

As shown in FIG. 10, the selector control circuit 13 includes a D flip-flop 41, an EXCLUSIVE-OR (EOR) gate 42, and a resettable D flip-flop 47. The input terminal C of the flip-flop 41 is subjected to a 100-kHz clock signal CLK. The input terminal D of the flip-flop 41 receives the highest bit or the most significant bit (MSB) of the output data from the ADC 2. The MSB of the output data from the ADC 2 is also fed to a first input terminal of the EOR gate 42. The output terminal Q of the flip-flop 41 is connected to a second input terminal of the EOR gate 42. The input terminal C of the flip-flop 47 receives the output signal from the EOR gate 42. The input terminal D of the flip-flop 47 is continuously subjected to a high level or "1". The reset terminal R of the flip-flop 47 is subjected to the output signal from the level detector 12. The output terminal $\overline{Q}$ of the flip-flop 47 is connected to the selector 8.

The operation of the selector control circuit of FIG. 10 will now be described with reference to FIG. 11. The flip-flop 41 delays the MSB of the output data from the ADC 2 and applies the delayed signal to the EOR gate 42. Each time the MSB of the output data from the ADC 2 is inverted, the EOR gate 42 produces a pulse signal. The MSB of the output data from the ADC 2 corresponds to the sign of the output data from the ADC 2. The change of the sign occurs when the data value is around zero. Accordingly, the EOR gate 42 produces a pulse signal each time the digital output value from the ADC 2 passes through a point near zero, that is, crosses zero. When the digital output value (see the curve (A) in FIG. 11) from the ADC 2 decreases below a threshold value VT corresponding to the predetermined positive reference value, the output (see the waveform (B) in FIG. 11 (B)) from the level detector 12 changes from "1" to "0" (see the moment t0 in FIG. 11). This change of the output from the level detector 12 releases the flip-flop 47 from the reset state. Therefore, when the output digital value (see the curve (A) in FIG. 11) from the ADC 2 crosses zero, the output (see the waveform (C) in FIG. 11) from the flip-flop 47 changes from "1" to "0" (see the moment t1 in FIG. 11).

During the subsequent period, when the digital output value (see the curve (A) in FIG. 11) from the ADC 2 decreases below a threshold value −VT corresponding to the predetermined negative reference value (see the moment t2 in FIG. 11), the output (see the waveform (B) in FIG. 11) from the level detector 12 changes to "1". The "1" output from the level detector 12 sets the flip-flop 47 so that the output signal (see the waveform (C) in FIG. 11) from the flip-flop 47 changes to "1".

While the output signal from the flip-flop 47 remains "0", the output data from the ADC 2 is selected by the selector 8. While the output signal from the flip-flop 47 remains "1", the output data from the multiplier 5 is selected by the selector 8. Accordingly, when the level of the analog input signal is relatively large, the output data from the multiplier 5 is generally used. In cases where the level of the analog input signal decreases and then crosses zero, the output data from the multiplier 5 generally remains selected until the moment of the zero-crossing and the output data from the ADC 2 is used after the moment of the zero-crossing. In this way, some of the changes of the signal selection by the selector 8 is performed when the input analog signal crosses zero. In general, when the input analog signal crosses zero, a change of the signal selection does not cause a problem such as a waveform discontinuity. Accordingly, it is possible to prevent a distortion in the output signal upon the change of the signal selection.

It should be noted that the level detector 12 may be replaced by an overflow detector.

DESCRIPTION OF THE SEVENTH PREFERRED EMBODIMENT

Figure 12:
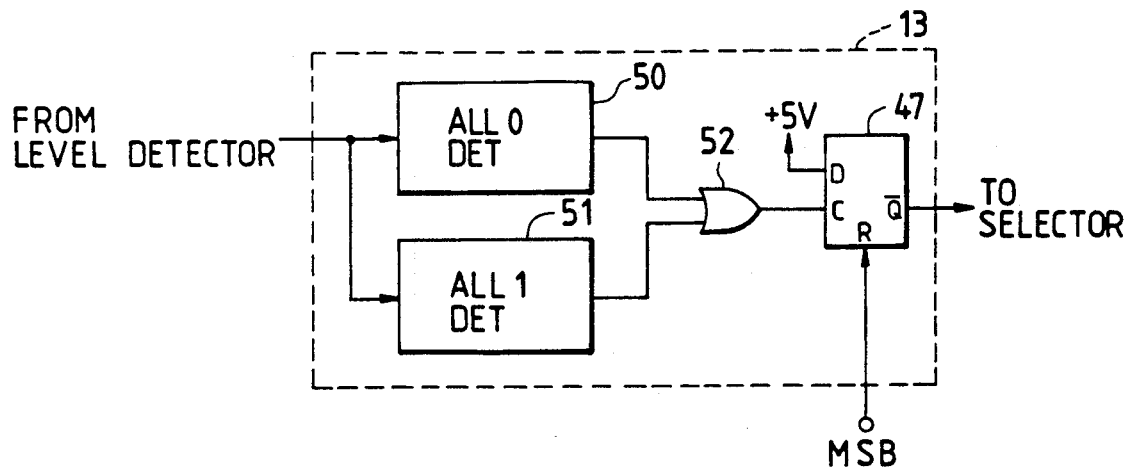
FIG. 12 is a block diagram of a selector control circuit in a seventh embodiment of this invention.
Figure 11:
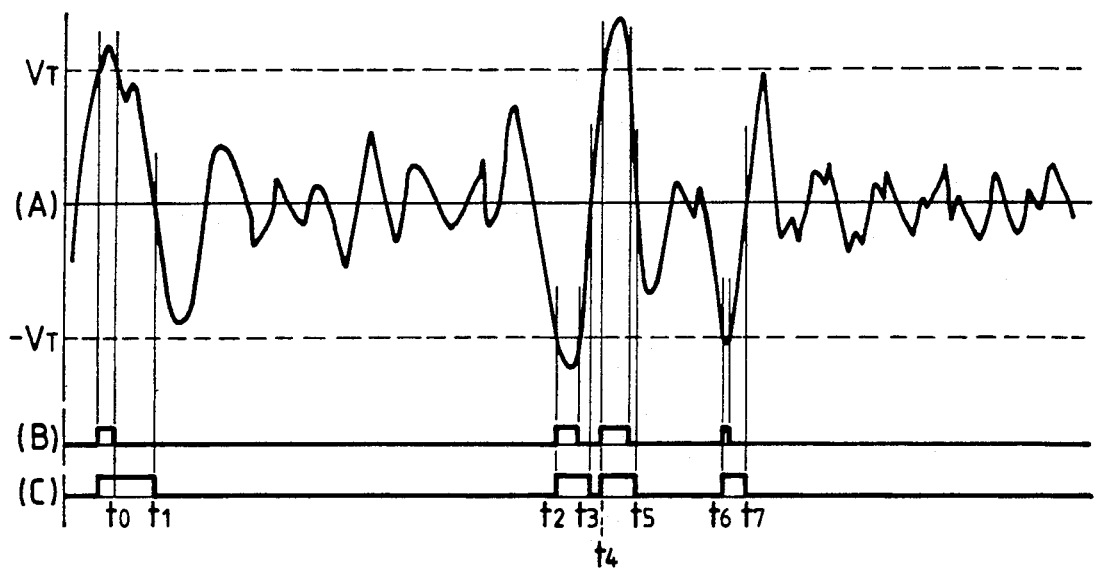
FIG. 11 is a timing diagram showing time-dependent variations of the states of various signals in the system of FIG. 9.

FIG. 12 relates to a seventh embodiment of this invention which is similar to the embodiment of FIGS. 9-11 except for the following design changes.

In the embodiment of FIG. 12, a selector control circuit 13 includes an ALL-0 detector 50, an ALL-1 detector 51, an OR gate 52, and a resettable D flip-flop 47. The combination of the flip-flop 41 and the EOR gate 42 (see FIG. 10) is replaced by the combination of the ALL-0 detector 50, the ALL-1 detector 51, and the OR gate 52. For example, the ALL-0 detector 50 is composed of a NOR gate. For example, the ALL-1 detector 51 is composed of an AND gate.

The higher 12 bits of the output data from an ADC 2 (see FIG. 9) are applied to the ALL-0 detector 50 and the ALL-1 detector 51. When all of the higher 12 bits of the output data from the ADC 2 are "0", the ALL-0 detector 50 outputs "1" to a first input terminal of the OR gate 52. Otherwise, the ALL-0 detector 50 outputs "0" to the OR gate 52. When all of the higher 12 bits of the output data from the ADC 2 are "1", the ALL-1 detector 51 outputs "1" to a second input terminal of the OR gate 52. Otherwise, the ALL-1 detector 51 outputs "0" to the OR gate 52. Accordingly, when the output digital value from the ADC 2 is in the range of "−16" to "+15", that is, when output digital value from the ADC 2 is around zero, the OR gate 52 outputs "1" to the input terminal C of the flip-flop 47.

In cases where the output digital value from the ADC 2 resides outside the range of "−16" to "+15", even when the output digital value from the ADC 2 crosses zero, the control signal from the selector control circuit 13 remains unchanged so that the data selection by a selector 8 (see FIG. 9) will not be changed. In other words, the change of the data selection by the selector 8 is allowed only when the level of the analog input signal is relatively small.

DESCRIPTION OF THE EIGHTH PREFERRED EMBODIMENT

Figure 13:
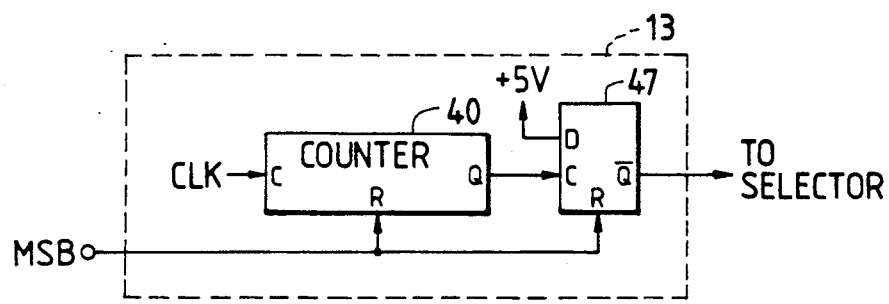
FIG. 13 is a block diagram of a selector control circuit in an eighth embodiment of this invention.

FIG. 13 relates to an eighth embodiment of this invention which is similar to the embodiment of FIGS. 9-11 except for the following design changes.

In the embodiment of FIG. 13, a selector control circuit 13 includes a counter 40 and a resettable D flip-flop 47. The counter 40 is of 7-bit type. When the reset terminal R of the counter 40 is subjected to "0", the counter 40 counts pulses of a 4-kHz clock signal CLK applied to the input terminal C thereof. When the reset terminal R of the counter 40 receives "1", the counter 40 is reset. The reset terminal R of the counter 40 is connected to the output terminal of a level detector 12 (see FIG. 9). The output terminal Q of the counter 40 is connected to the input terminal C of the flip-flop 47.

The operation of the selector control circuit 13 of FIG. 13 will now be described with reference to FIG. 14. When the digital output value (see the curve (A) in FIG. 14) from an ADC 2 (see FIG. 9) decreases below a positive threshold value VT (see the moment t0 in FIG. 14), the output (see the waveform (B) in FIG. 14) from the level detector 12 (see FIG. 9) changes from "1" to "0". This change of the output from the level detector 12 releases the counter 40 and the flip-flop 47 from their reset states. As a result, the counter 40 starts to count clocks of the clock signal CLK. Since the counter 40 is of the 7-bit type, the counter 40 outputs "1" when the counted pulse number reaches 128. The output "1" from the counter 40 changes the output signal (see the waveform (C) in FIG. 14) of the flip-flop 47 to change from "1" to "0" (see the moment t1 in FIG. 14). Since the frequency of the clock signal CLK is 4 kHz, the output signal from the flip-flop 47 changes from "1" to "0" approximately 32 ms (see the period T in FIG. 14) after the output digital value from the ADC 2 decreases below the positive threshold value VT.

During a subsequent period, when the output digital value (see the curve (A) in FIG. 14) from the ADC 2 decreases below a negative threshold value −VT (see the moment t2 in FIG. 14), the level detector 12 outputs "1" (see the waveform (B) in FIG. 14) so that the counter 40 and the flip-flop 47 are reset. Thereafter, when the output digital value (see the curve (A) in FIG. 14) increases above the negative threshold value −VT (see the moment t3 in FIG. 14), the counter 40 starts the counting operation. In cases where the output digital value (see the curve (A) in FIG. 14) from the ADC 2 exceeds the positive threshold value VT (see the moment t4 in FIG. 14) before a time of 32 ms elapses from the start of the counting operation, the counter 40 is reset and the flip-flop 47 continues to output "1" (see the waveform (C) in FIG. 14). Accordingly, provided that the output digital value from the ADC 2 remains between the positive and negative threshold values for 32 ms or longer, the output from the flip-flop 47 is allowed to change from "1" to "0" and the corresponding change of the data selection by a selector 8 (see FIG. 9) is allowed. In this way, frequent changes of the data selection by the selector 8 are prevented when the output digital value from the ADC 2 quickly moves up and down at large amplitudes.

Figure 14:
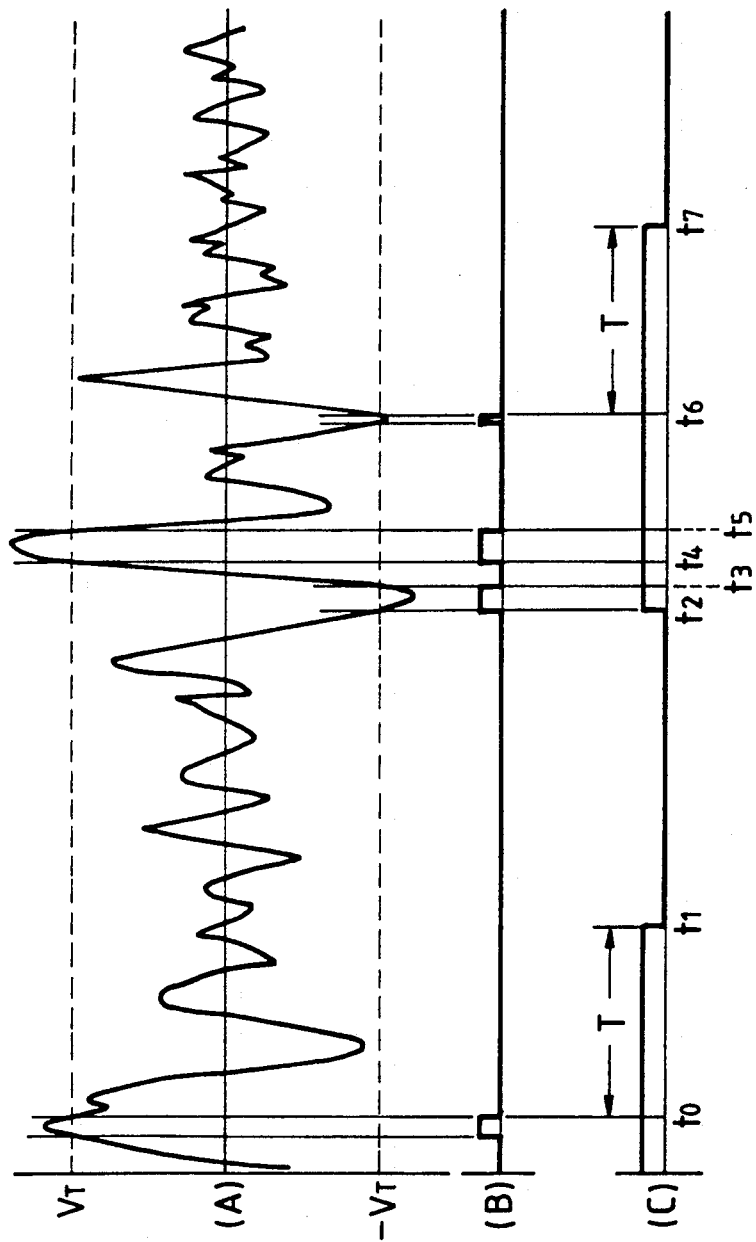
FIG. 14 is a timing diagram showing time-dependent variations in the states of various signals in the eighth embodiment.

While the time constant corresponding to the period T of FIG. 14 is about 32 ms in this embodiment, the time constant may be other values such as 100 ms.

DESCRIPTION OF THE NINTH PREFERRED EMBODIMENT

Figure 15:
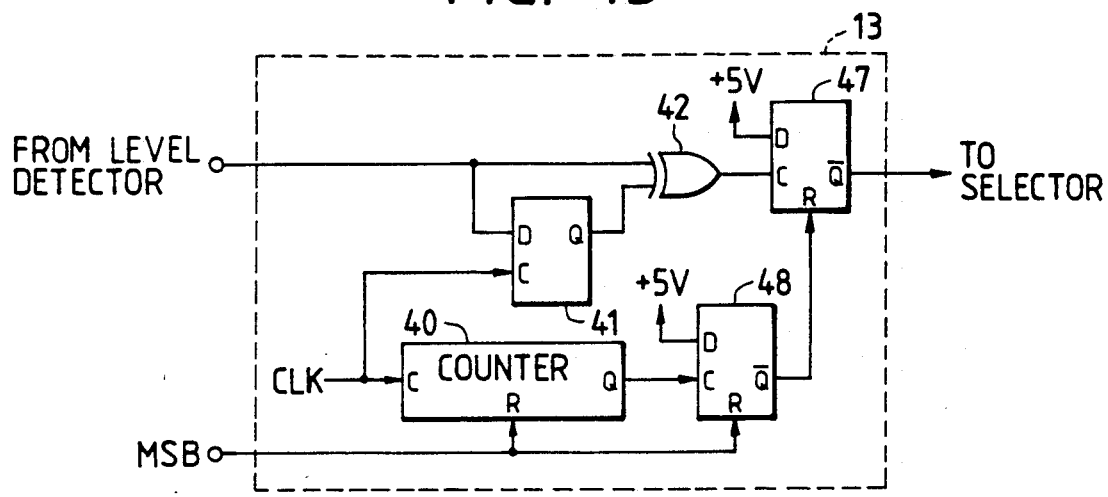
FIG. 15 is a block diagram of a selector control circuit in a ninth embodiment of this invention.

FIG. 15 relates to a ninth embodiment of this invention which is similar to the embodiment of FIGS. 9-11 except for the following design changes.

In the embodiment of FIG. 15, a selector control circuit 13 includes a D flip-flop 41, an EOR gate 42, a resettable D flip-flop 47, a 7-bit counter 40, and a resettable D flip-flop 48. The flip-flop 41, the EOR gate 42, and the flip-flop 47 are connected as in the selector control circuit of FIG. 10. The input terminal C of the counter 40 receives a 4-kHz clock signal CLK. The 4-kHz clock signal CLK is also applied to the input terminal C of the flip-flop 41. The reset terminals R of the counter 40 and the flip-flop 48 are subjected to the output signal from a level detector 12 (see FIG. 9). The output terminal Q of the counter 40 is connected to the input terminal C of the flip-flop 48. The input terminal D of the flip-flop 48 is continuously subjected to a high level or "1". The output terminal $\overline{Q}$ of the flip-flop 48 is connected to the reset terminal R of the flip-flop 47.

The operation of the selector control circuit 13 of FIG. 15 will now be described with reference to FIG. 17. When the digital output value (see the curve (A) in FIG. 17) from an ADC 2 (see FIG. 9) decreases below a positive threshold value VT (see the moment t0 in FIG. 17), the output (see the waveform (B) in FIG. 17) from the level detector 12 (see FIG. 9) changes from "1" to "0". This change of the output from the level detector 12 releases the counter 40 and the flip-flop 48 from their reset states. As a result, the counter 40 starts to count clocks of the clock signal CLK. At this time, the reset terminal R of the flip-flop 47 is subjected to "1" from the flip-flop 48 so that the flip-flop 47 is in its reset state and the flip-flop 47 outputs "1". Since the counter 40 is of the 7-bit type, the counter 40 outputs "1" when the counted pulse number reaches 128. The output "1" from the counter 40 changes the output signal of the flip-flop 48 to change from "1" to "0" (see the moment t1 in FIG. 14). Since the frequency of the clock signal CLK is 4 kHz, the output signal from the flip-flop 48 changes from "1" to "0" approximately 32 ms after the output digital value from the ADC 2 decreases below the positive threshold value VT. This change of the output signal from the flip-flop 48 releases the flip-flop 47 from its reset state. During a subsequent period, when the output digital value (see the curve (A) in FIG. 17) from the ADC 2 crosses zero at first (see the moment t2 in FIG. 17), the EOR gate 42 outputs a pulse signal which changes the output signal (see the waveform (C) in FIG. 17) of the flip-flop 47 from "1" to "0". Subsequently, when the output digital value (see the curve (A) in FIG. 17) from the ADC 2 decreases below a negative threshold value −VT (see the moment t3 in FIG. 17), the level detector 12 outputs "1" (see the waveform (B) in FIG. 14) so that the counter 40 and the flip-flop 48 are reset. Thus, the flip-flop 48 outputs "1", resetting the flip-flop 47 and changing the output (see the waveform (C) in FIG. 17) of the flip-flop 47 to "1". Thereafter, when the output digital value (see the curve (A) in FIG. 17) increases above the negative threshold value −VT (see the moment t4 in FIG. 17), the counter 40 starts the counting operation. In cases where the output digital value (see the curve (A) in FIG. 17) from the ADC 2 exceeds the positive threshold value VT (see the moment t5 in FIG. 17) before a time of 32 ms elapses from the start of the counting operation, the counter 40 is reset and the flip-flop 47 continues to output "1" (see the waveform (C) in FIG. 17). Accordingly, provided that the output digital value from the ADC 2 remains between the positive and negative threshold values for 32 ms or longer, the output from the flip-flop 47 is allowed to change from "1" to "0" and the corresponding change of the data selection by a selector 8 (see FIG. 9) is allowed. In this way, frequent changes of the data selection by the selector 8 are prevented when the output digital value from the ADC 2 quickly moves up and down at large amplitudes.

Figure 17:
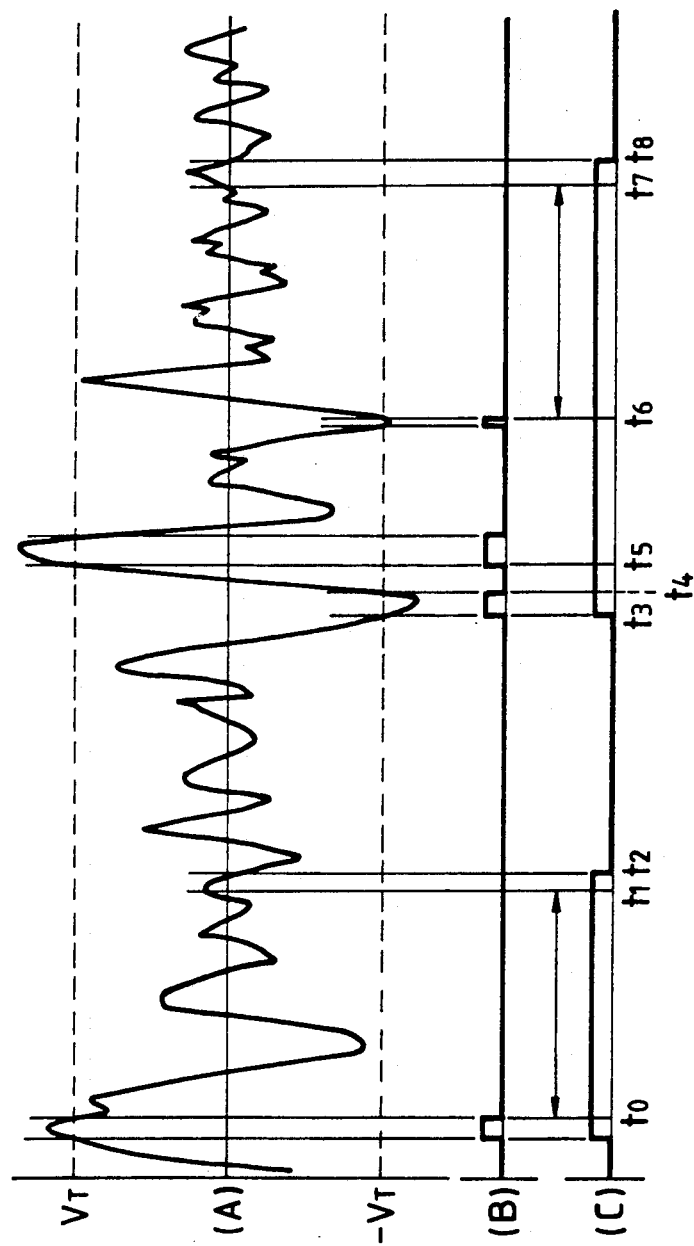
FIG. 17 is a timing diagram showing time-dependent variations in the states of various signals in the ninth embodiment.

While the time constant corresponding to the period T of FIG. 17 is about 32 ms in this embodiment, the time constant may be other values such as 100 ms.

DESCRIPTION OF THE TENTH PREFERRED EMBODIMENT

Figure 16:
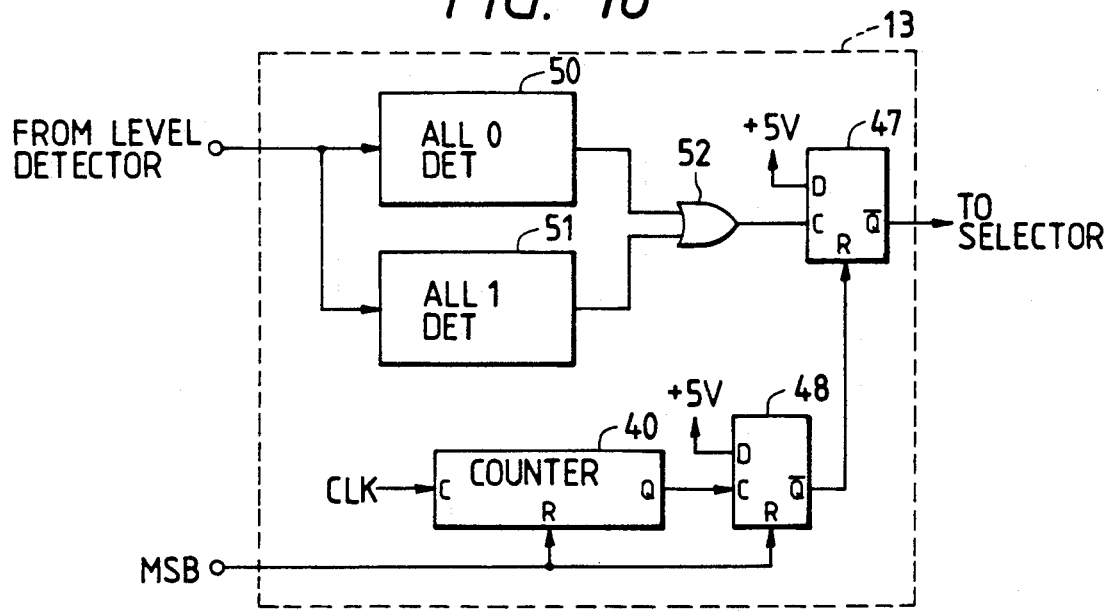
FIG. 16 is a block diagram of a selector control circuit in a tenth embodiment of this invention.

FIG. 16 relates to a tenth embodiment of this invention which is similar to the embodiment of FIG. 12 except for the following design changes.

In the embodiment of FIG. 16, a selector control circuit 13 includes an ALL-0 detector 50, an ALL-1 detector 51, an OR gate 52, a resettable D flip-flop 47, a 7-bit counter 40, and a resettable D flip-flop 48. The ALL-0 detector 50, the ALL-1 detector 51, the OR gate 52, and the flip-flop 47 are connected as in the selector control circuit of FIG. 12. The input terminal C of the counter 40 receives a 4-kHz clock signal CLK. The reset terminals R of the counter 40 and the flip-flop 48 are subjected to the output signal from a level detector 12 (see FIG. 9). The output terminal Q of the counter 40 is connected to the input terminal C of the flip-flop 48. The input terminal D of the flip-flop 48 is continuously subjected to a high level or "1". The output terminal $\bar{Q}$ of the flip-flop 48 is connected to the reset terminal R of the flip-flop 47.

The higher 12 bits of the output data from an ADC 2 (see FIG. 9) are applied to the ALL-0 detector 50 and the ALL-1 detector 51. When all of the higher 12 bits of the output data from the ADC 2 are "0", the ALL-0 detector 50 outputs "1" to a first input terminal of the OR gate 52. Otherwise, the ALL-0 detector 50 provides "0" to the OR gate 52. When all of the higher 12 bits of the output data from the ADC 2 are "1", the ALL-1 detector 51 outputs "1" to a second input terminal of the OR gate 52. Otherwise, the ALL-1 detector 51 outputs "0" to the OR gate 52. Accordingly, when the output digital value from the ADC 2 is in the range of "−16" to "+15", that is, when output digital value from the ADC 2 is around zero, the OR gate 52 outputs "1" to the input terminal C of the flip-flop 47. Similarly to the selector control circuit of FIG. 15, in cases where the output digital value from the ADC 2 decreases below the positive threshold value and then the output digital value from the ADC 2 remains between the positive and negative threshold values for 32 ms or longer, when the output digital value from the ADC 2 crosses zero at first, the output of the flip-flop 47 changes from "1" to "0". Thereafter, when the output digital value from the ADC 2 decreases below the negative threshold value or increases above the positive threshold value, the output of the flip-flop 47 changes from "0" to "1".

Provided that the output digital value from the ADC 2 moves into a given range around zero, the output from the flip-flop 47 can change regardless of whether the output digital value from the ADC 2 crosses zero. In cases where the output digital value from the ADC 2 remains outside the range of "−16" to "+15", the output from the flip-flop 47 does not change even when the output digital value from the ADC 2 crosses zero. Accordingly, provided that the output digital value from the ADC 2 reliably remains at small values for an appreciable time, the output from the flip-flop 47 is allowed to change from "1" to "0" and the corresponding change of the data selection by a selector 8 (see FIG. 9) is allowed. In this way, frequent changes of the data selection by the selector 8 are prevented when the output digital value from the ADC 2 quickly moves up and down at large amplitudes.

While the range of the output digital value from the ADC 2 which is used in changing the data selection extends between "−16" to "+15" in this embodiment, this range may extend between other values.

What is claimed is:

1. An analog-to-digital converting system comprising:
   means for converting a first analog input signal into a plurality of second analog signals having different levels respectively;
   a plurality of analog-to-digital converters;
   means for applying the second analog signals to the inputs of respective converters;
   means for adjusting values of output signals from the respective converters as a function of magnitudes of the values of the output signals from the respective converters to convert the output signals from the respective converters into respective adjusted signals;
   means for selecting one of the adjusted signals in response to whether or not the values of the output signals from the respective converters are in a predetermined range; and,
   means for providing the selected signal as a system output signal.

2. The system of claim 1 wherein the adjusting means and the selecting means comprise:
   means for calculating a ratio between values of the output signals from the converters;
   means for adjusting the values of the output signals from the converters as a function of the calculated ratio to obtain the adjusted signals; and,
   means for selecting one of the adjusted signals as the system output signal in response to whether or not the values of the output signals from the converters are in a predetermined range.

3. The system of claim 1 wherein the adjusting means and the selecting means comprise:
   means for calculating a ratio between values of the output signals from the converters;
   means for adjusting the smallest of the values of the output signals from the converters as a function of the calculated ratio; and, means for selecting one of the output signals from the means for adjusting a smallest of the values, and the output signals from the converters other than that having the smallest value as the system output signal in response to whether or not the values of the output signals from the converters are in a predetermined range.

4. The system of claim 1 wherein the adjusting means and the selecting means comprise:
means for calculating a ratio between values of the output signals from the converters;
second adjusting means for adjusting the values of the output signals from the converters which differ from a smallest of the values of the output signals from the converters as a function of the calculated ratio; and,
means for selecting one of the output signals from the second adjusting means and the smallest of the values of the output signals from the converters as the system output signal in response to whether or not the values of the output signals from the converters are in a predetermined range.

5. The system of claim 1 wherein the adjusting means and the selecting means comprise:
means for comparing the adjusted signals with a smallest of the values of the output signals from the converters;
means for controlling the adjusting means as a function of an output signal from the comparing means; and,
means for selecting one of the adjusted signals and the smallest of the values of the output signals from the converters as the system output signal in response to whether or not the values of the output signals from the converters are in a predetermined range.

6. The system of claim 1 wherein the adjusting means and the selecting means comprise:
means for adjusting a smallest of the values of the output signals from the converters;
means for comparing an output signal from the smallest-adjusting means with the values of the output signals from the converters which differ from the smallest of the values of the output signals from the converters;
means for controlling the smallest-adjusting means in response to an output signal from the comparing means; and,
means for selecting one of the output signals from the smallest-adjusting means and the output signals from the converters which have the values different from the smallest of the values of the output signals from the converters as the system output signal in response to whether or not the values of the output signals from the converters are in a predetermined range.

7. The system of claim 1 wherein the adjusting means and the selecting means comprise:
means for comparing the adjusted signals, unrelated to a smallest of the values of the output signals from the converters, with the smallest of the values of the output signals from the converters;
means for controlling the adjusting means in response to an output signal from the comparing means; and,
means for selecting one of the adjusted signals and the smallest of the values of the output signals from the converters as the system output signal in response to whether or not the values of the output signals from the converters are in a predetermined range.

8. An analog-to-digital converting system comprising:
means for converting a first analog input signal into a plurality of second analog signals having different levels, respectively;
a plurality of analog-to-digital converters;
means for applying the second analog signals to the respective converters;
means for calculating a ratio between values of output signals from the converters;
means for using one of the output signals from the converters as a reference signal;
means for adjusting the values of the output signals from the respective converters which differ from the reference signal to convert the output signals from the respective converters into respective adjusted signals as a function of the calculated ratio;
means for selecting one of the adjusted signals and the reference signal;
means for changing the selection by the selecting means when the values of the output signals from the converters exceed a predetermined value;
means for, in cases where the values of the output signals from the converters are smaller than the predetermined value, detecting that the values of the output signals from the converters are substantially zero, whereby a zero crossing is detected;
means for changing the selection by the selecting means when the detecting means detects that the values of the output signals from the converters are substantially zero, whereby a zero crossing is detected; and
means for providing an output signal from the selecting means as a system output signal.

9. An analog-to-digital converting system comprising:
means for converting a first analog input signal into a plurality of second analog signals having different levels respectively;
a plurality of analog-to-digital converters;
means for applying the second analog signals to the respective converters;
means for calculating a ratio between values of output signals from the converters;
means for using one of the output signals from the converters as a reference signal;
means for adjusting the values of the output signals from the respective converters which differ from the reference signal to convert the output signals from the respective converters into respective adjusted signals as a function of the calculated ratio;
means for selecting one of the adjusted signals and the reference signal;
means for changing the selection by the selecting means when the values of the output signals from the converters exceed a predetermined value;
means for, in cases where the values of the output signals from the converters become and remain smaller than the predetermined value, allowing the changing of the selection after a predetermined time elapses from a moment at which the values of the output signals from the converters become smaller than the predetermined value; and
means for providing an output signal from the selecting means as a system output signal.

10. An analog-to-digital converting system comprising:

means for converting a first analog input signal into a plurality of second analog signals having different levels, respectively;

a plurality of analog-to-digital converters;

means for applying the second analog signals to the respective converters;

means for calculating a ratio between values of output signals from the converters;

means for using one of the output signals from the converters as a reference signal;

means for adjusting the values of the output signals from the respective converters which differ from the reference signal to convert the output signals from the respective converters into respective adjusted signals as a function of the calculated ratio;

means for selecting one of the adjusted signals and the reference signal;

means for changing the selection by the selecting means when the values of the output signals from the converters exceed a predetermined value;

means for, in cases where the values of the output signals from the converters are smaller than the predetermined value, detecting that the values of the output signals from the converters are indicating a zero crossing, after a predetermined time elapses from a moment at which the values of the output signals from the converters become smaller than the predetermined value;

means for changing the selection by the selecting means when the detecting means detects that the values of the output signals from the converters are substantially zero; and means for providing an output signal from the selecting means as a system output signal.

11. An analog-to-digital converting system comprising:

means for deriving a first analog signal of a lower level and a second analog signal of a higher level from an original input analog signal;

a first analog-to-digital converter converting the first analog signal into a corresponding first digital signal;

a second analog-to-digital converter converting the second analog signal into a corresponding second digital signal;

means for detecting an overflow of the second converter;

means for selecting one of the first and second digital signals to obtain a system output signal in response to whether or not the detecting means detects an overflow of the second converter.

12. The system of claim 11 further comprising means for detecting a ratio between values of the first and second digital signals when the detecting means does not detect an overflow of the second converter, means for equalizing the values of the first and second digital signals by use of the detected ratio, and means for feeding the equalized first and second digital signals to the selecting means, whereby one of said equalized signals may be selected as a system output signal.

13. The system of claim 11 wherein the detecting means comprises means for detecting that a value of the second digital signal is outside a predetermined range.

14. The system of claim 13 further comprising means for detecting that the value of the second digital signal is substantially zero and generating a zero-cross signal representative thereof, and means for controlling the selection by the selecting means in response to the zero-cross signal.

15. The system of claim 13 further comprising means for detecting that a predetermined time elapses from a moment at which the value of the second digital signal is within the predetermined range and generating a time signal representative thereof, and means for controlling the selection by the selecting means in response to the time signal.

* * * * *